United States Patent
Clark

(10) Patent No.: US 9,030,228 B1
(45) Date of Patent: May 12, 2015

(54) INTELLIGENT CURRENT DRIVE FOR BUS LINES

(71) Applicant: Atmel Corporation, San Jose, CA (US)

(72) Inventor: Lloyd Clark, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/095,694

(22) Filed: Dec. 3, 2013

(51) Int. Cl.
 *H03K 17/16* (2006.01)
 *H03K 19/00* (2006.01)
 *H03K 19/0175* (2006.01)

(52) U.S. Cl.
 CPC .... *H03K 19/0013* (2013.01); *H03K 19/017509* (2013.01)

(58) Field of Classification Search
 USPC ................ 326/21, 26–28, 82, 86, 90
 See application file for complete search history.

(56) References Cited

U.S. PATENT DOCUMENTS

| 6,373,328 | B2* | 4/2002 | Rapp | 327/536 |
| 6,653,863 | B1* | 11/2003 | Tangen | 326/82 |
| 7,394,281 | B1* | 7/2008 | Bandholz et al. | 326/22 |
| 2011/0221521 | A1* | 9/2011 | Razzell et al. | 330/69 |
| 2011/0234306 | A1* | 9/2011 | Hioka et al. | 327/537 |

OTHER PUBLICATIONS

Linear Technology Corporation, "LTC1694: SMBus/I²C Accelerator", pp. 1-8.

* cited by examiner

*Primary Examiner* — Don Le
(74) *Attorney, Agent, or Firm* — Fish & Richardson P.C.

(57) ABSTRACT

An intelligent current drive is disclosed that couples an active current source to a bus line to increase the rate of pull-up and decouples the active current source from the bus line prior to reaching the desired pull-up voltage.

7 Claims, 2 Drawing Sheets

ID BRIEF DESCRIPTION OF THE DRAWINGS

INTELLIGENT CURRENT DRIVE FOR BUS LINES

TECHNICAL FIELD

This disclosure relates generally to methods of driving bus lines.

BACKGROUND

Pull-up resistors are often used at logic outputs where the logic device cannot source current such as open-collector transistor-to-transistor logic (TTL) devices. Such outputs are used for driving external devices or a logic bus with multiple devices connected to it.

The inter-integrated circuit (I²C) serial single-ended bus requires pull-up resistors on its clock (SCL) and data line (SDA) because the pins on the chips are of open-collector design. Pulling the bus line to ground indicates a logical zero while letting the bus line float to the rail voltage indicates a logical one. As a channel access method this allows one node to determine if another is transmitting by asserting an output, letting the external pull-up resistor pull the line to logic 1 level and monitoring the line state. If a second node pulls the line to zero, then the first node can detect that the other is transmitting.

Some disadvantages of pull-up resistors are the extra power consumed when current is drawn through the resistor and the slow rise time of the pull-up. A conventional solution to increase the speed of an open-collector or open-drain bus is to reduce the value of the pull-up resistor. Reducing the value of the pull-up resistor, however, increases power consumption making this conventional solution undesirable for low power applications.

SUMMARY

An intelligent current drive is disclosed that couples an active current source to a bus line to increase the rate of pull-up and decouples the active current source from the bus line prior to reaching the desired pull-up voltage.

In some implementations, a circuit comprises: a current source configured to couple to a bus line having an open-collector or open-drain current driver and a pull-up resistor; a first switch configurable to couple the current source to the bus line during a first portion of a rise time of bus line voltage and for disconnecting the current source from the bus line during a second portion of the rise time of the bus line voltage; a second switch configurable to pull-down or release the bus line voltage; and a switch signal generator coupled to the first and second switches and configured for configuring the first and second switches during the first and second portions of rise time.

In some implementations, a method comprises: receiving a signal to release a bus line having an open-collector or open-drain current driver and a pull-up resistor; releasing the bus line; coupling a current source to the bus line during a first portion of a rise time of the bus line voltage; and decoupling the current source from the bus line during a second portion of the rise time of the bus line voltage, where the second portion of rise time occurs after the first portion of rise time.

Particular implementations of the intelligent current drive provide one or more of the following advantages: 1) the speed of the bus is increased; and 2) relatively large values of pull-up resistors can be used, thus minimizing power consumption.

DETAILED DESCRIPTION

Example System

Figure 1:
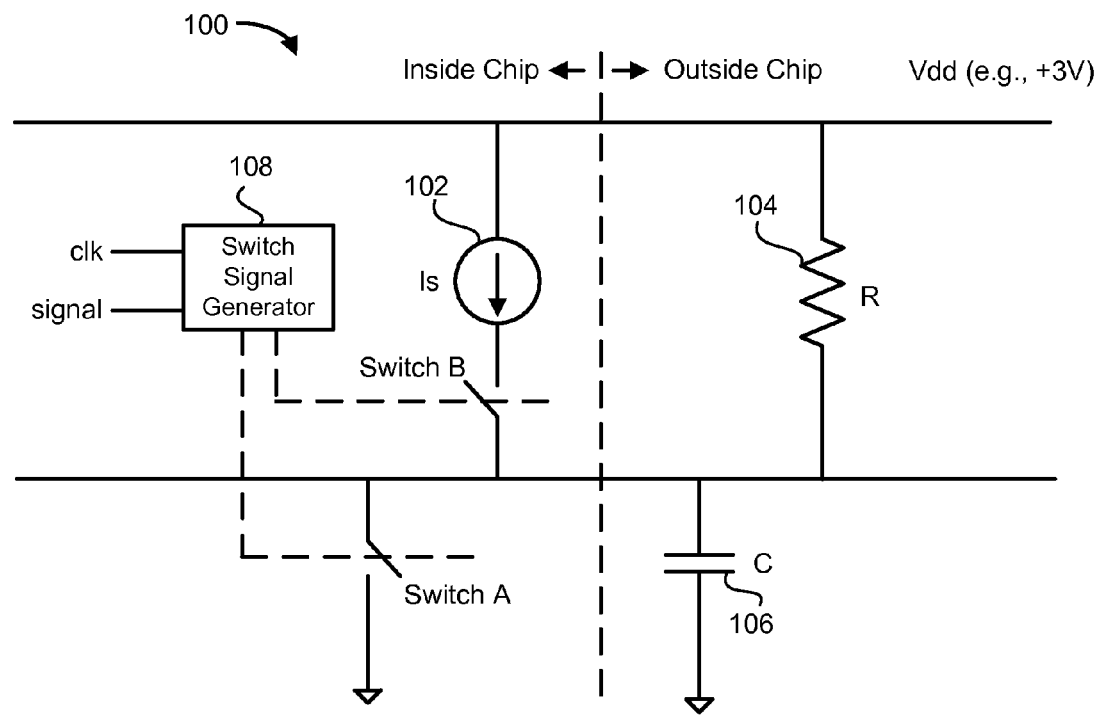
FIG. 1 is a conceptual diagram of an example of an intelligent current drive system.

FIG. 1 is a conceptual diagram of an example of an intelligent current drive system 100. In some implementations, system 100 can include active current source 102, pull-up resistor 104, bus capacitance 106 and switch signal generator 108. In some implementations, parts of system 100 can be implemented in an integrated circuit (IC) chip. For example, active current source 102 and switch signal generator 108 can be located inside the IC chip, and pull-up resistor 104 and bus capacitance 106 can be located outside the IC chip. System 100 can be used as a current drive for any bus that uses open-collector or open-drain pull-up resistors, such as the I²C serial bus.

System 100 operates by configuring switches A and B to enable current source 102 to inject current into a bus line at the moment the bus line is being released. Switches A and B can be transistors (e.g., MOSFET transistors) that are biased to behave as switches. Switches A and B can be configured by switch signal generator 108.

Switch signal generator 108 can be coupled to an input clock and data signal. The data signal can be used to release the bus line. For a bus running I²C protocol the clock input can be the I²C clock signal (SCL) and the input data signal can be the I²C data line (SDA), where pulling the SDA data line to ground indicates a logical zero while letting the SDA data line float to the rail voltage indicates a logical one.

Current source 102 is enabled for a short amount of time, typically one or two clock cycles, so that it will not interfere with some other device coupled to the bus that attempts to pull the bus line low. By enabling current source 102 for a short period of time (e.g., 40 ns), the rate at which the bus voltage rises $$\frac{\Delta V}{\Delta T}$$

is determined by $$\frac{I_s}{C},$$

where $I_s$ is me value of current source 102 (e.g., 3 mA) and C is bus capacitance 106 (e.g., 100 pF). This relationship is expressed mathematically as $$\frac{\Delta V}{\Delta T} = \frac{I_s}{C}. \qquad [1]$$

Without system 100, the rise time would be determined by pull-up resistor 104 multiplied by bus capacitance 106 (RC constant), and since bus capacitance 106 is fixed it would be necessary to make pull-up resistor 104 small to achieve a fast rise time and therefore fast bus speed. A small pull-up resistor 104 (e.g., 700Ω) consumes more power. With system 100, pull-up resistor 104 can be larger (e.g., 1300Ω), thereby reducing power consumption.

Figure 2:
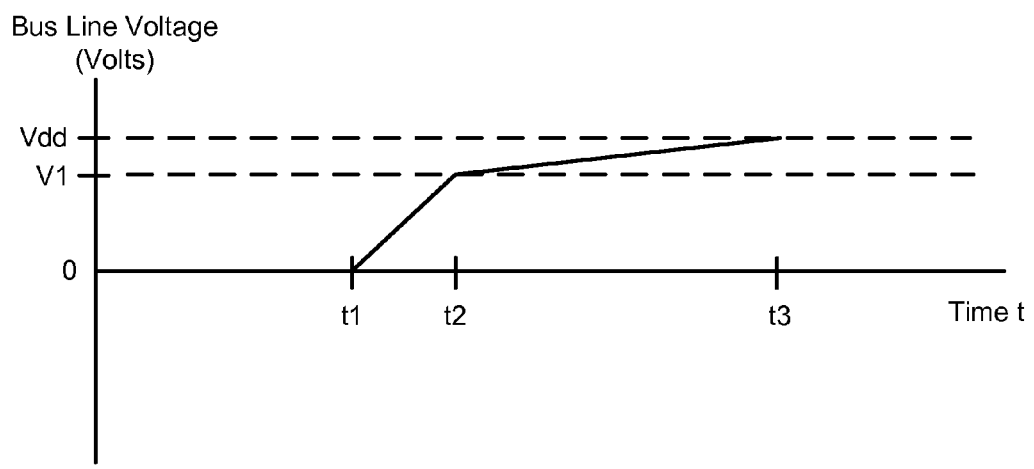
FIG. 2 is plot of bus voltage versus time to illustrate the operation of the intelligent current drive system of FIG. 1.

FIG. 2 is plot of bus voltage versus time to illustrate the operation of system 100 of FIG. 1. For this example, we assume that prior to time t1, switch A is closed and switch B is open, disconnecting current source 102 from the bus line and pulling down the bus line voltage (e.g., a logic 0 state). At time t1, switch A is opened to release the bus line and switch B is closed for N clock cycles (e.g., 2 clock cycles) while switch A remains open. This circuit configuration allows current from current source 102 to be injected into the bus line, raising the bus line voltage Vdd at a faster rate than without the current injection.

At time t2 and prior to reaching the desired bus line voltage Vdd (V1<Vdd), switch A remains open and switch B is opened, disconnecting current source 102 from the bus line. System 100 remains in this state until the desired bus line voltage (e.g., Vdd=3V or logic 1 state) is reached at time t3. An exemplary duration of time between t0 and t1 can be 75 ns. An exemplary duration of time between t1 and t2 can be 40 ns. An exemplary duration of time between t2 and t3 can be 35 ns.

Figure 3:
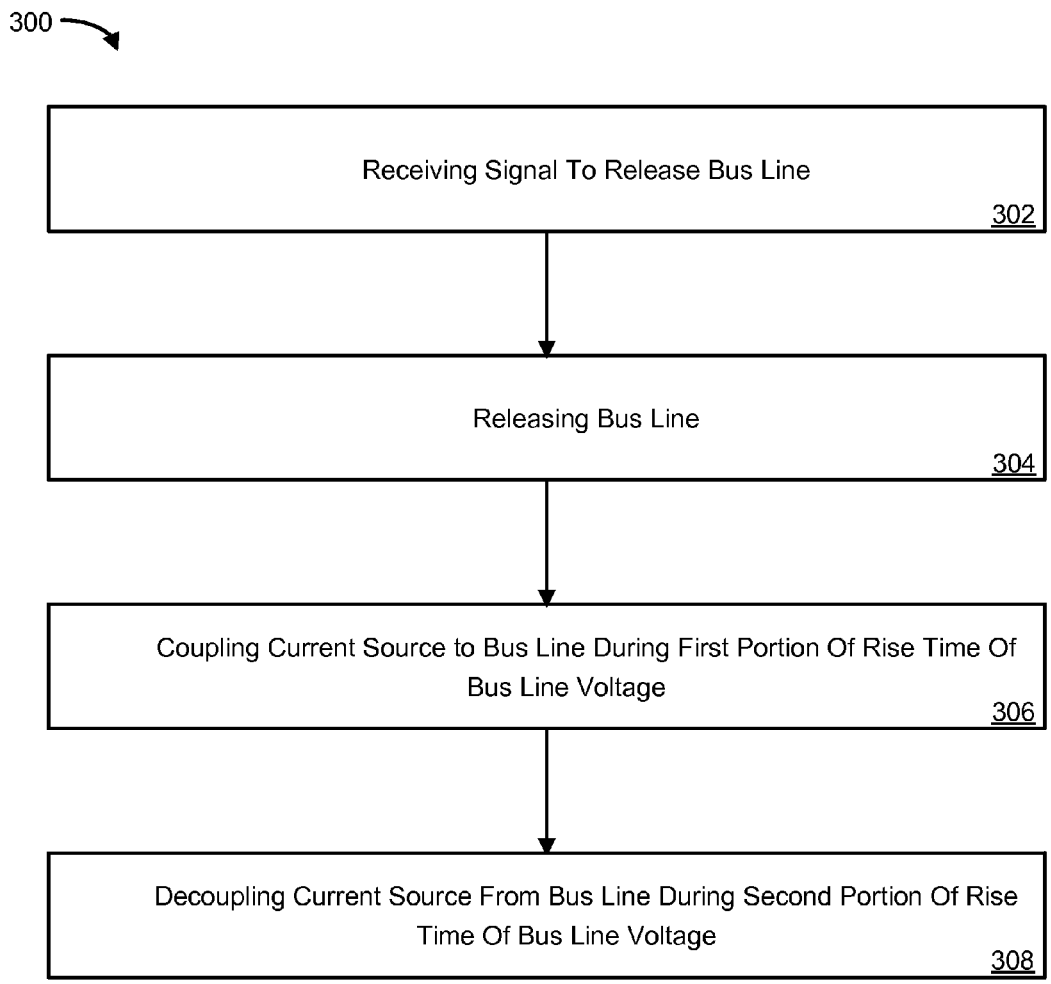
FIG. 3 is a flow diagram of an example process implemented by the intelligent current drive system of FIG. 1.

FIG. 3 is a flow diagram of an example process 300 implemented by intelligent current drive system 100 of FIG. 1. Process 300 can be implemented by system 100.

Process 300 can begin by receiving a signal to release a bus line (302), where the bus line is coupled to an open-collector or open-drain current drive and a pull-up resistor. The bus line is released in response to the signal (304), allowing the bus line voltage to rise. For example, switch signal generator 108 can send and/or generate one or more switch signals to open switch A and switch B.

Process 300 can continue by coupling current source 102 to the bus line during a first portion of a rise time of the bus line voltage (306). For example, switch signal generator 108 can send and/or generate one or more switch signals to close switch B and keep switch A open, thereby coupling the current source to the bus line through switch B. This results in current source 102 injecting current into the bus line. This switch configuration can be held for N clock cycles (e.g., 2 clock cycles) during which time the bus line voltage rises at a rate that is faster than the rate the bus line voltage would rise if the current source were not injecting current into the bus line. The number of clock cycles can be selected based on the particular bus protocol being used and tuned as needed.

After N clock cycles, process 300 can continue by decoupling the current source (308), allowing the bus line voltage to continue to rise (float) to the desired bus line voltage but at a slower rate than when current source 102 was injecting current into the bus line. For example, switch signal generator 108 can send and/or generate one or more switch signals to open switch B and keep switch A open. To configure system 100 to pull down the bus line voltage in response to the data signal, switch A can be closed while switch B is kept open.

While this document contains many specific implementation details these details should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuit comprising:
   a current source configured to couple to a bus line having an open-collector or open-drain current driver and a pull-up resistor;
   a first switch configurable to couple the current source to the bus line during a first portion of a rise time of bus line voltage and for disconnecting the current source from the bus line during a second portion of the rise time of the bus line voltage;
   a second switch configurable to pull-down or release the bus line voltage; and
   a switch signal generator coupled to the first and second switches and configured for configuring the first and second switches during the first and second portions of rise time.

2. The circuit of claim 1, wherein the bus line is compliant with inter-integrated circuit (I²C) bus protocol.

3. The circuit of claim 1, where the first and second switches are transistors that are biased to behave as switches.

4. A method comprising:
   receiving a signal to release a bus line having an open-collector or open-drain current driver and a pull-up resistor;
   releasing the bus line;
   coupling a current source to the bus line during a first portion of a rise time of the bus line voltage; and
   decoupling the current source from the bus line during a second portion of the rise time of the bus line voltage, where the second portion of rise time occurs after the first portion of rise time.

5. The method of claim 4, further comprising:
   configuring a first switch to release the bus line; and
   configuring a second switch to couple and decouple the current source to and from the bus line.

6. The method of claim 5, where the first and second switches are transistors that are biased to behave as switches.

7. The circuit of claim 1, wherein the bus line is compliant with inter-integrated circuit (I²C) bus protocol.

* * * * *

UNITED STATES PATENT AND TRADEMARK OFFICE
CERTIFICATE OF CORRECTION

| | |
|---|---|
| PATENT NO. | : 9,030,228 B1 |
| APPLICATION NO. | : 14/095694 |
| DATED | : May 12, 2015 |
| INVENTOR(S) | : Lloyd Clark |

Page 1 of 1

It is certified that error appears in the above-identified patent and that said Letters Patent is hereby corrected as shown below:

In the claims,

Col. 4, line 54, Claim 7, delete "The circuit of claim 1," and insert -- The method of claim 4, -- therefor.

Signed and Sealed this
Twentieth Day of October, 2015

Michelle K. Lee
*Director of the United States Patent and Trademark Office*